(12) United States Patent
Lee et al.

(10) Patent No.: US 8,101,526 B2
(45) Date of Patent: Jan. 24, 2012

(54) METHOD OF MAKING DIAMOND NANOPILLARS

(75) Inventors: Shuit-Tong Lee, Hong Kong SAR (CN); Wenjun Zhang, Hong Kong SAR (CN); Igor Bello, Hong Kong SAR (CN); You-Sheng Zou, Jiangxi Province (CN)

(73) Assignee: City University of Hong Kong, Kowloon (HK)

( * ) Notice: Subject to any disclaimer, the term of this patent is extended or adjusted under 35 U.S.C. 154(b) by 851 days.

(21) Appl. No.: 12/046,673

(22) Filed: Mar. 12, 2008

(65) Prior Publication Data

US 2009/0233445 A1   Sep. 17, 2009

(51) Int. Cl.
*H01L 21/461* (2006.01)
(52) U.S. Cl. ........................ 438/720; 438/947
(58) Field of Classification Search .................. None
See application file for complete search history.

(56) References Cited

U.S. PATENT DOCUMENTS

| | | | | |
|---|---|---|---|---|
| 4,407,695 A | * | 10/1983 | Deckman et al. | 216/42 |
| 5,458,733 A | * | 10/1995 | Tessmer et al. | 216/67 |
| 5,471,947 A | * | 12/1995 | Southworth et al. | 117/94 |
| 5,588,894 A | * | 12/1996 | Jin et al. | 445/24 |
| 6,902,716 B2 | | 6/2005 | Lee et al. | |
| 2004/0079280 A1 | * | 4/2004 | Lee et al. | 117/89 |

OTHER PUBLICATIONS

Nishibayashi, et al., Development of "Diamond Nano-Emitters", Jan. 2004, SEI Technical Review, No. 57, p. 31-36.*
Gordon, Cameron, Dynamization evolution of Dry Etch Tools in Semiconductor Device Fabrication,[online], Publish Internet Date Dec. 8, 2005, [retrieved on Dec. 2010], Retrieved from, http://www.triz-journal.com/archives/2005/12/2005-12.pdf.*
Lee, et al. CVD diamond films: nucleation and growth, Materials Science and Engineering, 1999,25, 123-154.*
D. Ingert, Alternative Masks for Nanolithography, 2007, The Open Physical Chemistry Journal, Bentham Science Publishers Ltd., 10-17.*
Musda, H. et al., "Synthesis of well-aligned diamond nanocylinders", *Adv. Mater*, 13(4):247-249 (Feb. 2001).
Ando, Y. et al., "Nano-rods of single crystalline diamond", *Diamond and Related Materials*, 23:633-637 (2004).
Mishima, O et al., "High-temperature Cubic Boron Nitride P-N Junction Diode Made at High Pressure", *Science*, 238, pp. 181-183 (Oct. 1987).
Novikov, N. V., "New trends in high-pressure synthesis of diamond", *Diamond and Related Materials*, 8:1427-1432 (1999).
Zhang, W. J. et al., "Structuring single- and nano-crystalline diamond cones", *Diamond and Related Materials*, 13:1037-1043 (2004).
Loh, K. P., et al. "Negative electron affinity of cubin boron nitride", *Diamond and Related Materials*, 8:781-784 (1999).
Jiang, X., et al., "Heteroepitaxial diamond growth on (100) silicon", *Diamond and Related Materials*, 2:1112-1113 (1993).
Yoshida, T., "Vapour phase deposition of cubic boron nitride", *Diamond and Related Materials*, 5:501-507 (1996).

(Continued)

*Primary Examiner* — Binh X Tran
*Assistant Examiner* — David Cathey, Jr.
(74) *Attorney, Agent, or Firm* — Leydig, Voit & Mayer, Ltd.

(57) ABSTRACT

A method for fabricating diamond nanopillars includes forming a diamond film on a substrate, depositing a metal mask layer on the diamond film, and etching the diamond film coated with the metal mask layer to form diamond nanopillars below the mask layer. The method may also comprise forming diamond nuclei on the substrate prior to forming the diamond film. Typically, a semiconductor substrate, an insulating substrate, a metal substrate, or an alloy substrate is used.

17 Claims, 4 Drawing Sheets

OTHER PUBLICATIONS

Mirkarimi, P. B. et al., "Review of advances in cubin boron nitride film synthesis", *Materials Science and Engineering*, R21:47-100 (1997).

Zhang, W. J. et al., "Expitaxy on Diamond by Chemical Vapor Deposition: A Route to High-Quality Cubin Boron Nitride for Electronic Applications", *Advanced Materials*, 16(16):1405-1408 (Aug. 2004).

* cited by examiner

METHOD OF MAKING DIAMOND NANOPILLARS

BACKGROUND TO THE INVENTION

1. Field of the Invention

This invention relates to the fabrication of diamond nanopillars. The invention also relates to diamond nanopillar arrays.

2. Background Information

Due to its unique combination of outstanding physical and chemical properties, such as wide band-gap, chemical inertness, the highest hardness and thermal conductivity, negative electron affinity, and biocompatibility, diamond is considered to be a promising material for application in electronic and micro-electromechanical devices, biomedical sensors and electrochemical electrodes, and field electron emission (FEE) devices. Diamond can be synthesized in bulk crystalline forms using a high-pressure and high-temperature method and in film forms employing chemical vapor deposition (CVD), typically in a hydrogen environment (including plasma) with a carbon precursor. Highly-oriented diamond films have been available and prepared on various substrates using bias-enhanced nucleation (BEN) and by controlling the growth parameters. Nanocrystalline diamond (nano-D) films have recently attracted considerable interest as they overcome the great surface roughness which is a consequence of the faceted morphology of polycrystalline diamond films, but retain to a large extent the extreme properties of polycrystalline diamond films.

The application of diamond in the electrochemistry and biomedical fields has attracted increasing research interest, such as in chemically inert biochemical micro-reactors and ultra-low friction micro-electromechanical sensors. Diamond is known as a biocompatible material, consisting of only carbon atoms. Compared with other electrode materials, such as gold, platinum or glassy carbon, the diamond electrode exhibits a low and stable voltammetric and amperometric background current, leading to an enhanced signal-to-background ratio (S/B), weak adsorption of polar molecules, a wide electrochemical potential window in aqueous media, long-term response stability, and great fouling resistance and chemical inertness. The superior properties of a diamond electrode make it ideally suited for in vitro or in vivo biomedical applications in chemically aggressive environments.

The potential applications of diamond depend not only on its intrinsic properties, but also on the surface geometries in which it appears. The surface functionalization of nanostructured diamond is widely recognized as a viable approach to extend and/or enhance its applications. In particular, increasing the surface area may improve the efficiency and sensitivity in electrode and sensor applications, which could open new frontiers in electro-analysis and stable biosensor. For example, a diamond pillar structure has application as two-dimensional photonic band-gap crystals for use in the near-infrared wavelength region, due to the high transparency and large refractive index of diamond in the undoped state. However, the extreme properties of diamond make it difficult to structure to a desired geometry to fully explore its advantages in different applications.

Single crystalline diamond cones with small tip radius and defined crystal orientation have been fabricated by utilizing reactive ion etching method [Lee Shuit-Tong, et al., U.S. Pat. No. 6,902,716]. Diamond pillars/cylinders have been synthesized by introducing an anodized porous alumina mold in CVD process. The diamond nanopillars formed have a uniform diameter of about 300 nm [H. Masuda, T. Yanagishita, K. Yasui, K. Nishio, L Yagi, T. N. Rao, A. Fujishima, *Adv. Mater.*, vol. 13, pps. 247-249, "Synthesis of well-aligned diamond nanocylinders", 2001]. Moreover, single crystalline diamond nanorods with a diameter of 50-200 nm have also been constructed from single crystalline diamond whisker by using reactive ion etching [Y. Ando, Y. Nishibayashi, A. Sawabe, Diamond. *Relat. Mater.*, vol. 13, pps. 633-637, "Nano-rods of single crystalline diamond", 2004].

SUMMARY OF THE INVENTION

The formation of high density diamond nanopillars can extend the application potential of diamond, particularly in the biomedical and electrochemical fields. Accordingly, it is an objection of the present invention to provide a method for fabricating high-density diamond nanopillars on a substrate. It is an alternative object of the present invention to provide a method for fabricating diamond nanopillars on a substrate which offers the art a useful alternative to the methods known hitherto.

According to the present invention a method for fabricating diamond nanopillars and their arrays comprises the steps of:
(1) forming a layer of diamond film on a substrate,
(2) depositing a metal mask layer on the diamond film, and
(3) etching the diamond film coated with the metal mask layer to form diamond nanopillars below the mask layer.

The method may also comprise a step of forming diamond nuclei on the substrate prior to forming the layer of diamond film. Typically, a semiconductor substrate, an insulator substrate, a metal substrate, or an alloy substrate is used.

The diamond film can be single-crystal diamond wafers, oriented (heteroepitaxial), randomly-oriented polycrystalline (poly-D), or nano-D films. The diamond films are preferably prepared in a two-step process, i.e., nucleation and growth. The diamond nuclei are preferably formed either by bias-enhanced nucleation or by mechanical prescratching/seeding. The diamond film including the poly-D and nano-D films may be grown by any conventional CVD process. The single crystal diamond wafer can be obtained by using high-pressure and high-temperature (HPHT) method.

On the diamond film, a nanoscale etching mask (e.g., a layer metal thin film) is pre-deposited by using the evaporation or sputtering methods, sized-selected colloidal metal particles or polymer-sphere lithography.

The etching of the diamond film is preferably carried out by applying a negative-bias in a hydrogen-based plasma. However, etching could be carried out by any chemically reactive environment in synergy with ion bombardment in plasma, or ion beams applied to the diamond films. If it is desired for the diamond nanopillar to be conductive, then this can be achieved by doping either during formation of the diamond film, or during the etching process. Doping may be carried out by introducing a boron-containing, a sulfur-containing, or a phosphorous-containing gas.

BRIEF DESCRIPTION OF THE DRAWINGS

The embodiments of the invention will be described by way of example and with reference to the accompanying drawings in which.

DETAILED DESCRIPTION OF THE PREFERRED EMBODIMENTS

The invention will now be illustrated in a preferred embodiment in which diamond nanopillars and their arrays are formed by (1) forming diamond nuclei on a substrate, (2) depositing a layer of diamond film on said substrate, (3) pre-depositing a nanoscale etching mask layer on the said diamond film, and (4) etching the said diamond film with mask layer into the diamond nanopillars. This exemplary embodiment is not intended however to limit the scope of use or functionality of the invention.

In embodiments of the present invention, the deposition of diamond film serving as the input materials for structuring the diamond nanopillars can be prepared on a variety of non-diamond substrates including semiconductors (e.g., silicon or silicon carbide and nitride), insulators (e.g., quartz and sapphire), metals (e.g., platinum and iridium), and alloys (e.g., tungsten carbide). The diamond film for structuring diamond nanopillars includes randomly-oriented polycrystalline diamond (poly-D), oriented (heteroepitaxial) diamond, nanocrystalline diamond (nano-D) films, and single-crystal diamond wafers. The deposition of diamond films is preceded by diamond nucleation on a pre-treated or/and pre-coated substrate. Firstly diamond is nucleated using either bias-enhanced nucleation on a non-diamond substrate or enhanced nucleation employing scratching non-diamond substrate by hard powders of different composition and size such as diamond, SiC, Al2O3 or cBN. Then randomly oriented or highly oriented diamond films are grown via controlling deposition parameters, and the nanocrystalline diamond film is also grown by changing the methane content or in hydrogen-depleted CVD environment.

In the preparation of diamond films, CVD environments including either cold and thermal plasmas being excited by direct current, alternating current, radio-frequency, microwave or other electromagnetic radiations are possible. The hot filament and flame methods can be applied as well. Depending on the excitation method used, power can be supplied into the plasma via internal electrodes, capacitive and inductive coupling, antenna coupling, resonator coupling, surface-wave excitation or other known methods. As seen, in the case of diamond film deposition demonstrated as an example below, cold plasma was induced by microwaves, which were fed into a reactor via an impedance transformer.

Figure 1:
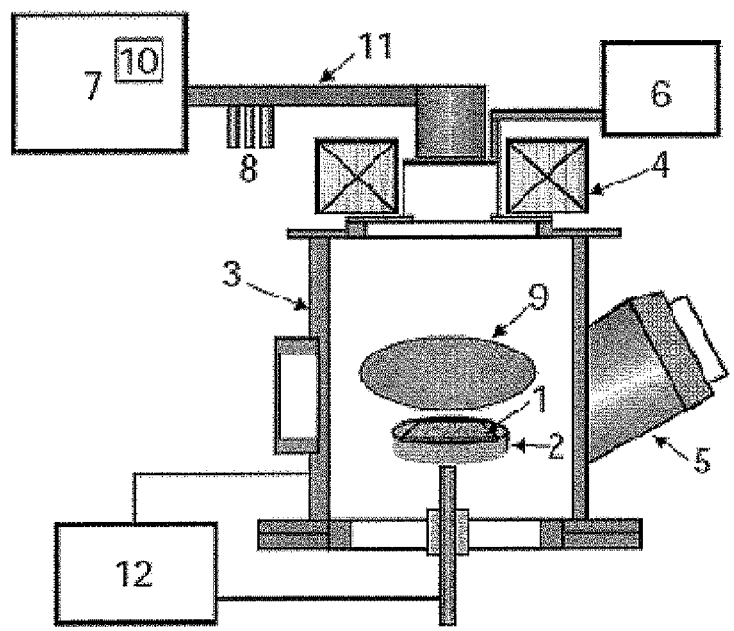
FIG. 1 is a schematic view of an apparatus for the use in carrying out a method according to an embodiment of this invention.

FIG. 1 shows the schematic diagram of a microwave plasma apparatus employed for fabricating diamond nanopillars in accordance with an embodiment of this invention. The apparatus includes sample 1, sample holder 2, reaction chamber 3, magnetic coil 4, turbomolecular pump 5, gas supply units 6, 2.45 GHz microwave generator 7, impedance transformer 8, plasma ball 9, powermeter 10, waveguide 11, and biasing power supply 12.

In the embodiments of the present invention, the etching masks include the thin metal films, size-selected colloidal metal particles and polymer-sphere lithography. Furthermore, the etching mask can also be well patterned to form the desired diamond nanopillar arrays. The thin metal film masks (e.g., gold, silver, nickel, copper and aluminum) may be deposited on the surface of diamond film by using the evaporation or sputtering methods. The metal films aggregate to form nano-dots during the etching process and act as the etching masking for fabricating the diamond nanopillars. The deposition of colloidal metal (e.g. gold and silver) particles on the surface of diamond is an alternative choice for etching mask. Taking advantage of the size selectivity of colloidal metal particles, it is possible to form etching masks of desired size with extremely narrow size distribution.

The reactive ion etching (RIE) is carried out preferably in hydrogen-based plasma. Inert gases such as argon or helium, oxygen, nitrogen and halogen-containing gas (fluorine or chlorine) can be optionally added to the gas phase in order to control the plasma composition, plasma density, reaction rate, and phase purity of diamond nanopillars. As in the example given below the RIE is performed in a gas mixture of hydrogen and argon to fabricate the diamond nanopillars, making use of both the chemical etching by hydrogen atoms/ions and the enhanced physical etching by Ar ions. The optimum flow rates of such reactant gases considerably vary depending on the plasma type, method of plasma generation, gas pressure, and other processing parameters.

The density, height and diameter of the diamond nanopillars can be set to desired values by adjusting the conditions of reactive ion etching (e.g. power supplied to the plasma, etching gases, etching pressure, negative bias voltage, substrate temperature, and etching time) and the variety of etching masks. The RIE can be performed at a gas pressure of $10^{-4}$ to $10^2$ Torr, and the substrate temperature ranges widely from room temperature to 1200 degrees-C. depending on the plasma generation method. Nevertheless, to obtain a suitable etching rate and to improve the phase purity of the nanopillars prepared, the optimal temperature range is from 600 to 1000 degrees-C. In the case of microwave mode operation described below, a suitable pressure is from 10 to 100 Torr. In addition, plasma etching may be performed in a plasma other than the microwave plasma, for example, a DC plasma, arc jet plasma, or flame plasma, electron cyclotron resonance (ECR) microwave plasma, inductive coupled plasma (ICP), or directly by ion beam irradiation.

During the etching process, the ion bombardment is crucial to the nanopillars formation. Therefore, a negative substrate bias including direct current, pulsed direct current, and/or radio-frequency bias is employed. The voltage may range from −50 V to −1000 V which is along with plasma potential responsible for the energy and momentum of incident ions. The substrate bias applied causes the secondary electron emission from diamond and thus induces a plasma sheath just above the diamond film. The secondary electron emission is unevenly distributed, which resulted in the inhomogeneous distributions the electrical field and cause the preferential etching in uncovered regions of diamond films. The set of bias voltage depends on many parameters such as the method to generate plasmas, the gas composition, the gas pressure and the substrate materials, which in turn determines the phase purity and geometry of the diamond nanopillars formed.

For the applications of diamond nanopillars in electrodes and sensors, the conductive diamond nanopillars may be required. The conductivity of diamond nanopillars can be realized by introducing a boron-containing gas either into the deposition environment during diamond growth or into the environment for RIE. Boron-containing gas sources include boron hydrides (e.g., diborane and decaborane), boron halides (e.g., boron trichloride and boron triflouride), borohydrides (e.g., sodium borohydride), borofluoride (e.g., ammonium borofluoride or trimethylboride—TMB), or organic boron compounds such as triethoxyboron. The optimum flow rate of such boron containing gas varies in accord with the electrical conductivity of diamond nanopillars required, plasma type, method of plasma generation, gas pressure, and gas composition. The practical range of molecular concentration of boron-containing gases in the plasma gas is from ppm level to several percent.

The following examples are presented for a further understanding of the formation and method to fabricate diamond nanopillars and their arrays under present invention.

Example 1

Nano-D films were deposited using a commercial ASTeX microwave plasma CVD (MWCVD) reactor equipped with a 5 kW microwave generator as shown in FIG. 1. N-type (001) silicon wafers of 3 inches in diameter were used as substrates. Prior to deposition, the substrate was ultrasonically abraded for 60 min in a suspension of nano-D powders with the grain size of ~5 nm in ethanol. A 10% $CH_4/H_2$ gas mixture was used as the reactive gas source for nano-D deposition. The total gas flow rate was 200 sccm and the pressure was maintained at 30 torr. The microwave power and deposition temperature were set at 1200 W and 800 degrees-C., respectively. The gold films employed as etching masks were deposited onto the deposited nano-D film with a magnetron sputtering system (Auto 306, Edwards). The thickness of the gold layer mask was about 5 nm.

Figure 2:
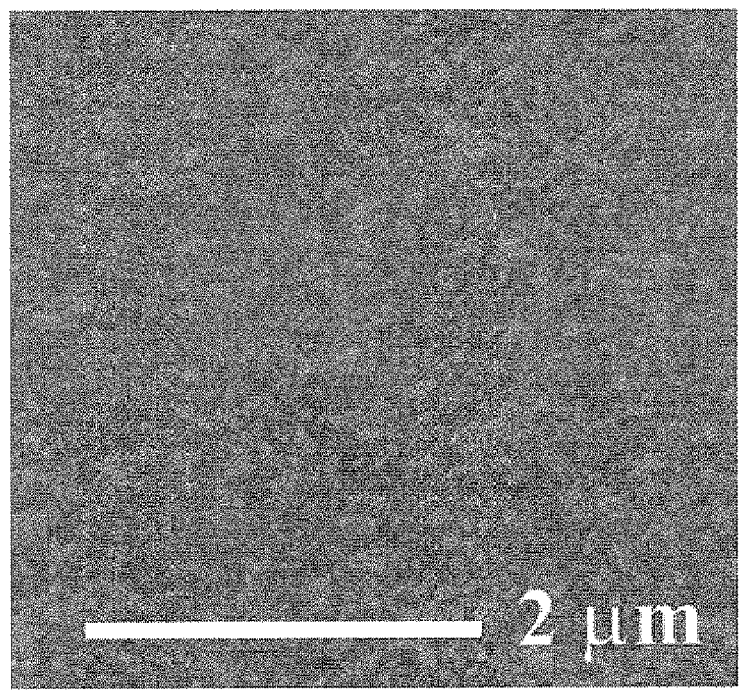
FIG. 2 is an illustrative plain-view image of the nano-D film pre-deposited with a gold layer using as the starting material to structure the nanopillars according to a first example of the invention.

FIG. 2 shows the SEM plain-view image of a nano-D film pre-coated with a thin gold mask layer. The sample was used as the starting material for structuring the nanopillars by subsequent RIE process. The nano-D film is continuous with a smooth surface, and the average grain size is about few tens nanometers. The coating of thin gold mask layer does not affect the surface morphology of nano-D films significantly.

The RIE of nano-D films prepared was also conducted in microwave plasma in the same apparatus as shown in FIG. 1, however with the gas mixture of hydrogen and argon as the reactant gases. The gas flow rate of hydrogen and argon was 110 and 90 sccm, respectively, and the pressure was maintained at 60 Torr. The microwave power was 2000 W over the entire duration of etching. In this particular case, direct current bias of −400 V, provided by a dc power supply, was applied to the substrate with respect to the grounded chamber. The nano-D film was etched at a substrate temperature of 850 degrees-C. for 9 minutes in order to obtain a nanopillar array.

Figure 3:
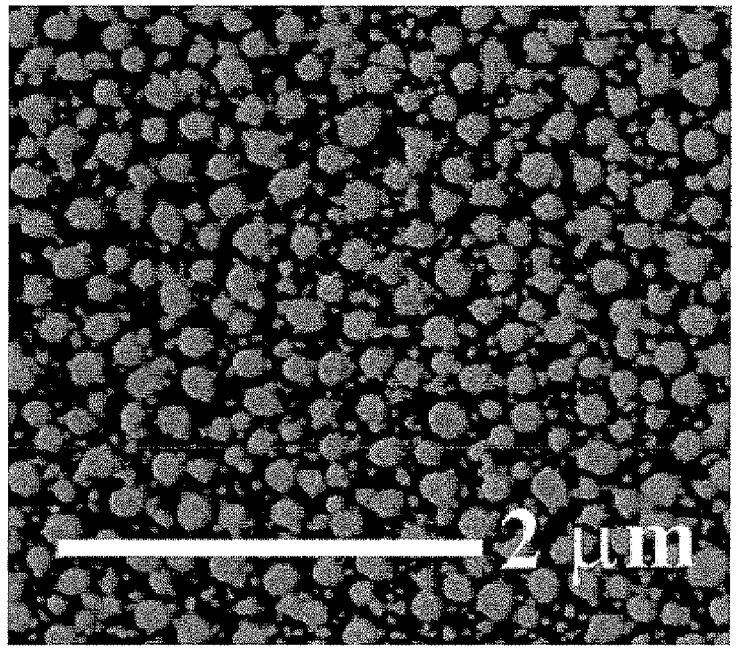
FIG. 3 is an illustrative plain-view image of the nano-D film with the gold nano-dots formed in accordance with the first example.
Figure 4:
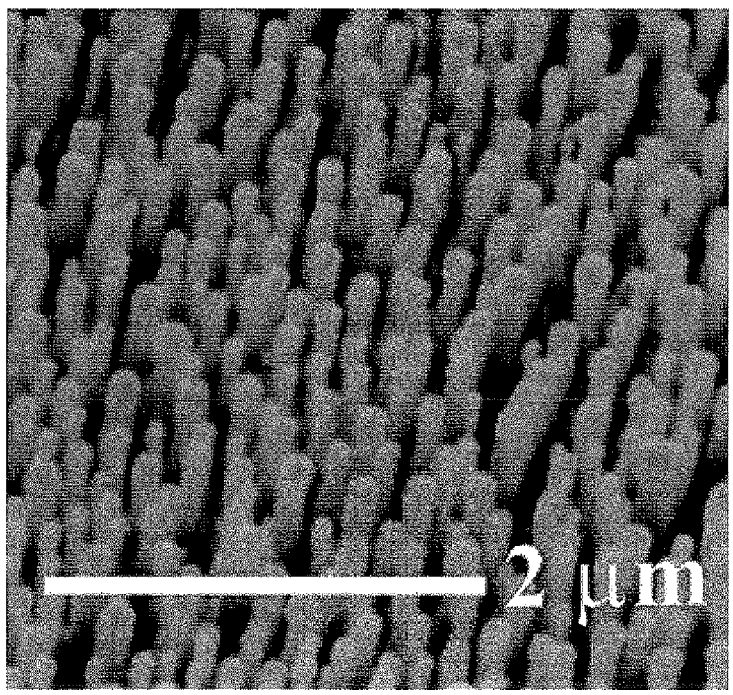
FIG. 4 is an illustrative 45 degree perspective-view image of an array of nano-D nanopillars formed in accordance with the first example.

At the initial etching stage, the pre-coated gold layer on the nano-D film aggregated easily to form gold nano-dots with the diameter in the range of 95-150 nm, as shown in FIG. 3. These gold nano-dots acted as a mask, preventing the diamond underneath from etching. During the etching process the size of gold dots was reduced gradually due to sputtering, and the residual gold particles can still be seen on the top of nano-D nanopillars as shown in FIG. 4. FIG. 4 is a SEM image of the structured nano-D nanopillars after etching for 9 min in the gas mixture of 45% $Ar/(Ar+H_2)$. It can be seen that the RIE as described above converted the flat nano-D film to nano-D nanopillars entirely. The nano-D nanopillars are well aligned, normal to the substrate. The nanopillars are uniform in diameter (~110 nm) and height (~500 nm), and the nanopillar density is about $10^8/cm^2$. Circle caps, which were identified to be gold by EDX, were observed on the top of nanopillars. Upon the requirements for different applications, the gold caps may be chemically etched away by using acid, e.g., aqua regia and nitric acid. The nano-D nanopillars height, diameter and density depend on the etching conditions (e.g. microwave power, gas pressure, substrate and etching time, etc.), and can be controlled according to the desired values.

Figure 5:
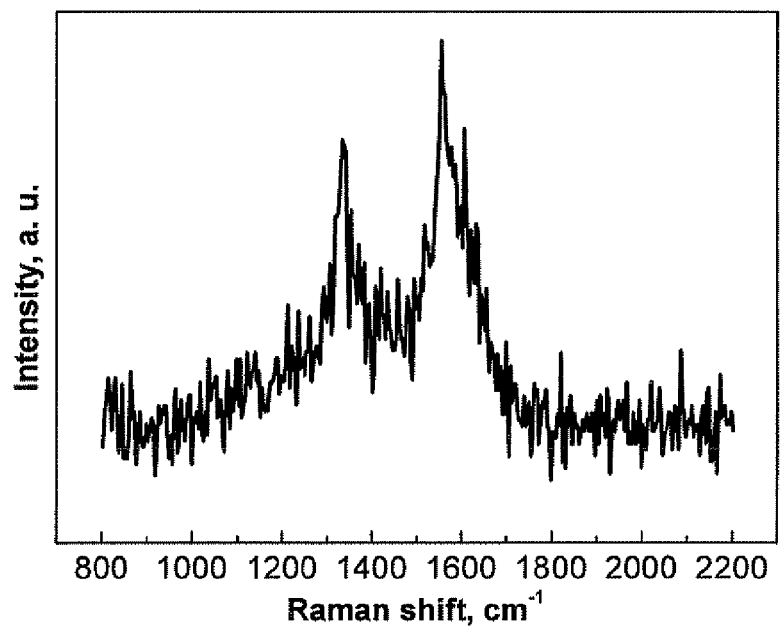
FIG. 5 is UV Raman spectra obtained from the nano-D nanopillars array shown in FIG. 4.

In order to further obtain information about the phase composition of nano-D nanopillars, UV Raman spectroscopy (wavelength: 229 nm, sport size: 1 μm) was employed to characterize the nano-D nanopillars shown in FIG. 4. A sharp and strong peak located at about 1332 $cm^{-1}$ and a broad peak at around 1580 $cm^{-1}$ are observed, which are characteristic to diamond and graphitic carbon, as depicted in FIG. 5 respectively. The spectrum is identical to that obtained for the pristine nano-D film, indicating that the RIE process does not vary the phase composition of nano-D films and the nanopillars fabricated still keep the nano-D nature.

Example 2

Micro-D films can also be structured into diamond nanopillar arrays. The micro-D deposition and structuring were performed in the same deposition system as described above in example 1. The bias-enhanced nucleation (BEN) was used to enhance nucleation for the micro-D deposition, and the BEN was performed in a 5% $CH_4$/95% $H_2$ gas mixture at dynamic pressure of 20 Torr provided with a total gas flow rate of 300 sccm. The plasma was induced with a microwave power of 800 W. The substrate temperature was 850 degrees-C. and substrate bias was maintained at −150 V. The BEN took 15 minutes. During the process of diamond growth, the methane concentration was reduced to 0.5%, the total gas flow was kept at 300 sccm, and the total pressure was adjusted to 30 torr. The substrate was maintained 800 degrees-C., while the microwave power was increased to 1200 W.

Figure 6:
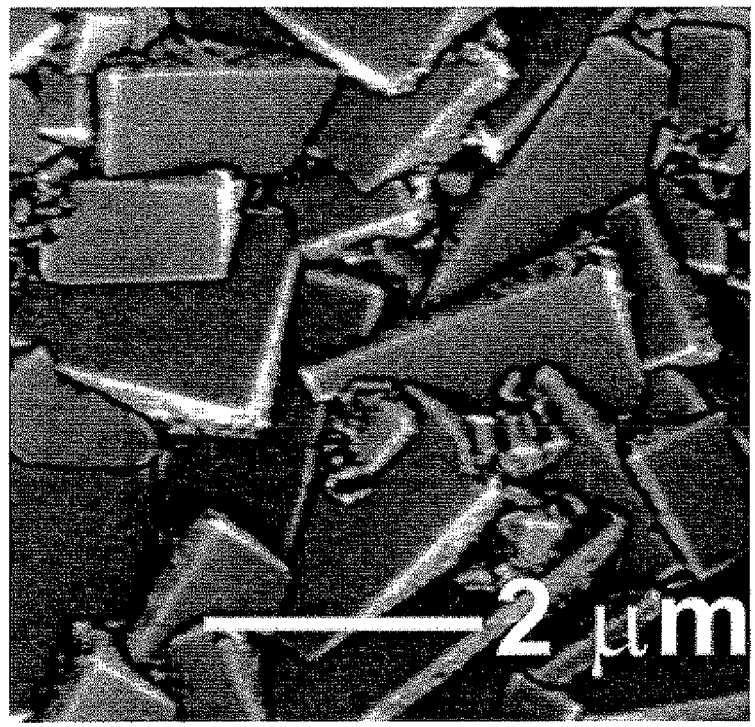
FIG. 6 is an illustrative plain-view image of the microcrystalline diamond (micro-D) used as the starting material for structuring the nanopillars according to a second example of the invention.

FIG. 6 shows the SEM plain-view image of a randomly-oriented micro-D film deposited on silicon substrate. The diamond film is about 6 μm thick. The grain size is not uniform ranging from several hundred nanometers to several microns, and the surface is rough. Prior to structuring the nanopillars, the micro-D film was coated with a gold film of about 5 nm thick as etching mask. The gold film deposition was performed in the same deposition system as described above in example 1.

The micro-D film coated with gold mask was then subjected to RIE process using the gas mixture of hydrogen and argon. The etching process was performed in the same apparatus as described in example 1. The etching was carried out in argon/hydrogen gas mixtures at a ratio of 3:2 with a total gas flow rate of 200 sccm to secure operation pressure of 60 Torr. The microwave power was 2000 W. A negative bias of 400 V was employed during RIE, and the etching during was 20 min.

Figure 7:
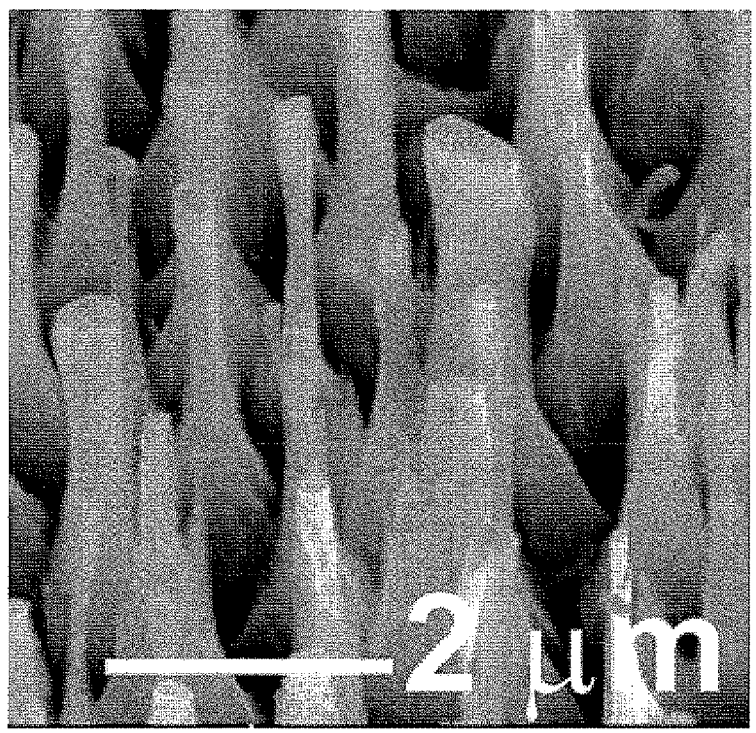
FIG. 7 is an illustrative 45 degree perspective-view image of micro-D nanopillars array formed in accordance with the second example.

In order to form the micro-D nanopillars with small diameter, the argon content has to be increased. FIG. 7 shows a SEM image of the micro-D nanopillars structured by RIE. It can be seen that the height of nanopillars is about 2 μm. In contrast to the nanopillars structured from nano-D film (FIG. 4), the micro-D film has a rough surface and non-uniform grain size, the gold nano-dots with different diameters are formed. As a result, the nanopillars shown here are not uniform in diameter which varies from 100 to 500 nm. Moreover, it is noted that the roots of the micro-D nanopillars are constructed into the conical configuration.

Figure 8:
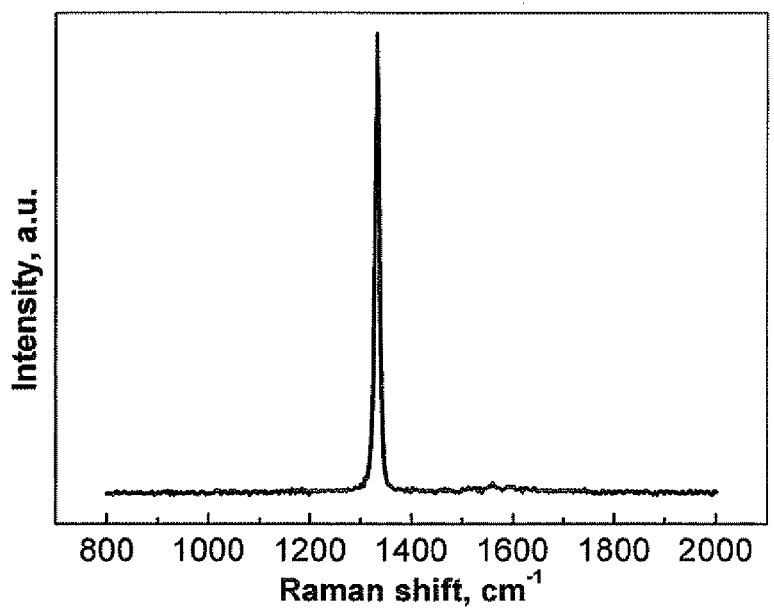
FIG. 8 is UV Raman spectra obtained from the micro-D nanopillars array shown in FIG. 7.

FIG. 8 shows the UV Raman spectrum collected from the array of micro-D nanopillars shown in FIG. 7. A sharp and strong peak located at about 1332 cm$^{-1}$ is observed, indicating that the nanopillars constructed are still in diamond structure with high purity.

It is possible to deposit large-area nano- and micro-diamond films on diverse substrates at a relatively low cost. The nano-D also has nearly the same combination of exceptional properties as single-crystal diamond, such as biocompatibility, chemical inertness and superb electrochemical properties. Thus, the conductive and good quality diamond nanopillar arrays that may be obtained using an embodiment of the present invention have potential advantages in applications such as electrochemical analysis and biomedical sensors due to the large surface area of the structured diamond nanopillars.

What is claimed is:

1. A method of fabricating an array of diamond nanopillars, comprising:
   forming a nano-crystalline diamond film on a substrate,
   depositing a metal layer covering the nano-crystalline diamond film,
   without patterning the metal layer, subjecting the nano-crystalline diamond film coated with the metal layer to reactive ion etching, with an electrical bias applied to the nano-crystalline diamond film, wherein, in the etching, the metal layer coalesces into masking dots, exposing parts of the nano-crystalline diamond film that are etched to form respective nano-crystalline diamond nanopillars between the substrate and the masking dots.

2. The method of claim 1 wherein the substrate is selected from the group consisting of a semiconductor substrate, an electrically insulating substrate, a metal substrate, and an alloy substrate.

3. The method of claim 1 further comprising forming diamond nuclei on the substrate prior to forming the nano-crystalline diamond film.

4. The method of claim 3 wherein forming the diamond nuclei on the substrate comprises at least one of seeding with a hard powder suspension, scratching the substrate prior to nucleation, and bias enhanced nucleation.

5. The method of claim 1 including forming the nano-crystalline diamond film by one of cold plasma deposition and thermal plasma deposition.

6. The method of claim 1 further comprising doping the nano-crystalline diamond film on the substrate.

7. The method of claim 6 including doping by introducing a gas during deposition of the nano-crystalline diamond film.

8. The method of claim 7 wherein the gas contains an element selected from the group consisting of boron, sulfur, and phosphorus.

9. The method of claim 8 wherein the element is boron and the gas is selected from the group consisting of boron hydrides, boron halides, borohydrides, borofluorides, and organic boron compounds.

10. The method of claim 1 including depositing the metal layer on the nano-crystalline diamond film by one of evaporation and sputtering.

11. The method of claim 1 including etching the nano-crystalline diamond film in a gas mixture comprising hydrogen.

12. The method of claim 11 wherein the gas mixture further includes a gas selected from the group consisting of argon, oxygen, nitrogen, fluorine, chlorine, and halogen-containing gases.

13. The method of claim 1 including applying a negative-electrical bias to the nano-crystalline diamond film during the etching.

14. The method of claim 11 wherein the gas mixture includes a doping gas for doping the nano-crystalline diamond nanopillars during the etching.

15. The method of claim 14 wherein the doping gas contains an element selected from the group consisting of boron, sulfur, and phosphorus.

16. The method of claim 15 wherein the element is boron and the doping gas is selected from the group consisting of boron hydrides, boron halides, borohydrides, borofluorides, and organic boron compounds.

17. The method of claim 1 including depositing a gold film having a thickness of about 5 nm as the metal layer on the nano-crystalline diamond film.

* * * * *